United States Patent

Tai et al.

[11] Patent Number: 5,994,167
[45] Date of Patent: Nov. 30, 1999

[54] METHOD OF MAKING A FIBERGLASS REINFORCED RESIN PLATE

[75] Inventors: George Tai, Taipei Hsien; El-Pon Jone, Chia I; Max Lin, Taipei, all of Taiwan

[73] Assignee: Zowie Technology Corporation, Taipei Hsien, Taiwan

[21] Appl. No.: 08/861,391

[22] Filed: May 21, 1997

[51] Int. Cl.$^6$ .......................... H01L 21/44; H01L 21/48; H01L 21/50; H05K 7/02
[52] U.S. Cl. ............................................ 438/109; 361/807
[58] Field of Search .......................... 438/51, 109; 200/5; 361/807

[56] References Cited

U.S. PATENT DOCUMENTS

| | | | |
|---|---|---|---|
| 3,827,048 | 7/1974 | Usui | 340/366 |
| 4,021,839 | 5/1977 | Denlinger | 357/74 |
| 4,079,268 | 3/1978 | Fletcher et al. | 307/151 |
| 5,177,330 | 1/1993 | Takashashi et al. | 200/5 |
| 5,491,111 | 2/1996 | Tai | 437/209 |

*Primary Examiner*—Brian Dutton
*Attorney, Agent, or Firm*—Rosenberg, Klein & Lee

[57] ABSTRACT

The subject invention relates to a method of production of fiberglass reinforced resin plate type semi-conductor diodes, by which the lead wiring of semi-conductor diode is directly included in the production of fiberglass reinforced resin (FRP) foundation plate, to supersede conventional lead frame, to enable the designing of any styles to suit actual needs, and with the design of connecting holes, several layers of different circuits can be connected to comprise 3-dimensional multi-layer circuits.

1 Claim, 4 Drawing Sheets

METHOD OF MAKING A FIBERGLASS REINFORCED RESIN PLATE

DESCRIPTION OF THE INVENTION

The subject invention relates to a way of production of fiberglass reinforced resin plate type semi-conductor diodes, by directly including the lead wiring of semi-conductor diode onto the fiberglass reinforced (FRP) resin plate, to replace conventional lead frame, so that various styles can be designed to meet actual requirements.

Conventionally, the prior art of "the production of fiberglass reinforced resin plate type semi-conductor diodes" includes the following steps. Please refer to FIGS. 1 and 2.

(1) Installation of core piece—The jump joint electrode 11 of guide piece 1 is press formed, the connecting rib 12 of the guide piece 1 is fold pressed and folded, so the welding end of jump joint electrode 11 is relocated to the bottom electrode plate 13. Then, place the core piece 2 at the left side of the welding end, use the guide plate to push it in between the slightly lifted welding end and the bottom electrode plate 13, then lower the welding end, so the core piece 2 is clamped between the welding end and the bottom electrode plate 13, and the installation of tube piece is completed.

(2) Welding—Heat with an electric oven to melt the solder 3 on the core piece 2 or on the guide piece 1. When cooled, weld the core piece 2 onto the welding joint of the welding end of jump joint electrode 11 and the core piece 2 of the bottom electrode plate 13. So the welding is completed.

(3) Corrosion of the section of core piece, oxidation, and sealing of the section of tube core piece.—Proceed with the chemical corrosion of the section of core piece 2 with the use of alkaline corrosive 4. After the corrosion is completed, the oxidizer 5 is used for silicone surface oxidation, to strengthen the formation of silicone oxide film. After drying process, the sealant 6 is painted onto the section of the core piece 2, and baked to cure;

(4) Filling of silicone resin and coating of adhesive on foundation plate core piece—Fill an appropriate amount of silicone resin 8 into the core hole 71 on the foundation plate 7, and paint the adhesive 9 onto the foundation plate 7;

(5) Installation of foundation plate—Put the core piece 2, with its welding surface 2 facing downwards, on the foundation plate 7, the core piece 2 and the jump joint electrode 11 in the core hole 71 on the foundation plate 7, bend and fold the guide piece protruding to the terminal 14 outside the foundation plate 7, thus forming the terminal 14 of the diodes, and the foundation plate 7 is installed;

(6) Installation of cover plate—Paint the adhesive 9 on the installing surface of guide piece 1, mount the cover plate 10 onto it and bend and fold the cover plate catch 15, so the cover plate is installed;

(7) Baking and curing of adhesive and silicone resin—Heat with electric oven to specified temperature setting and timing to cure the adhesive 9 and silicone resin 8;

(8) Rib removing, detecting, cutting, sorting and packaging of terminal—Test with electrical parameter tester, cut the identifying cut corner of electrode positive of the diode and assort individual diodes, and sort out the primary-grade diodes for automatic packaging process. Conventionally, the lead frame is used as the connecting wiring for semi-conductor diodes, but because the lead frame is limited to mechanical support, more sophisticated or finer wiring is impossible, and so, a number of different layers of wiring cannot be connected. Therefore, the applications of conventional models are greatly restricted.

Aimed at the improvement of said disadvantages, the subject invention involves innovated designs to directly include the circuit connecting with the semi-conductor diodes into the production of fiberglass reinforced resin foundation plate, to enhance its convenience in actual application, and to enable the designing of various styles to meet actual requirements; Meanwhile, by means of connecting holes, several different layers of wiring circuits can be connected to obtain better quality.

The technical measures and performances employed to achieve the aforesaid purposes and embodiment of the subject invention are illustrated below to enable full understanding.

Figure 1:
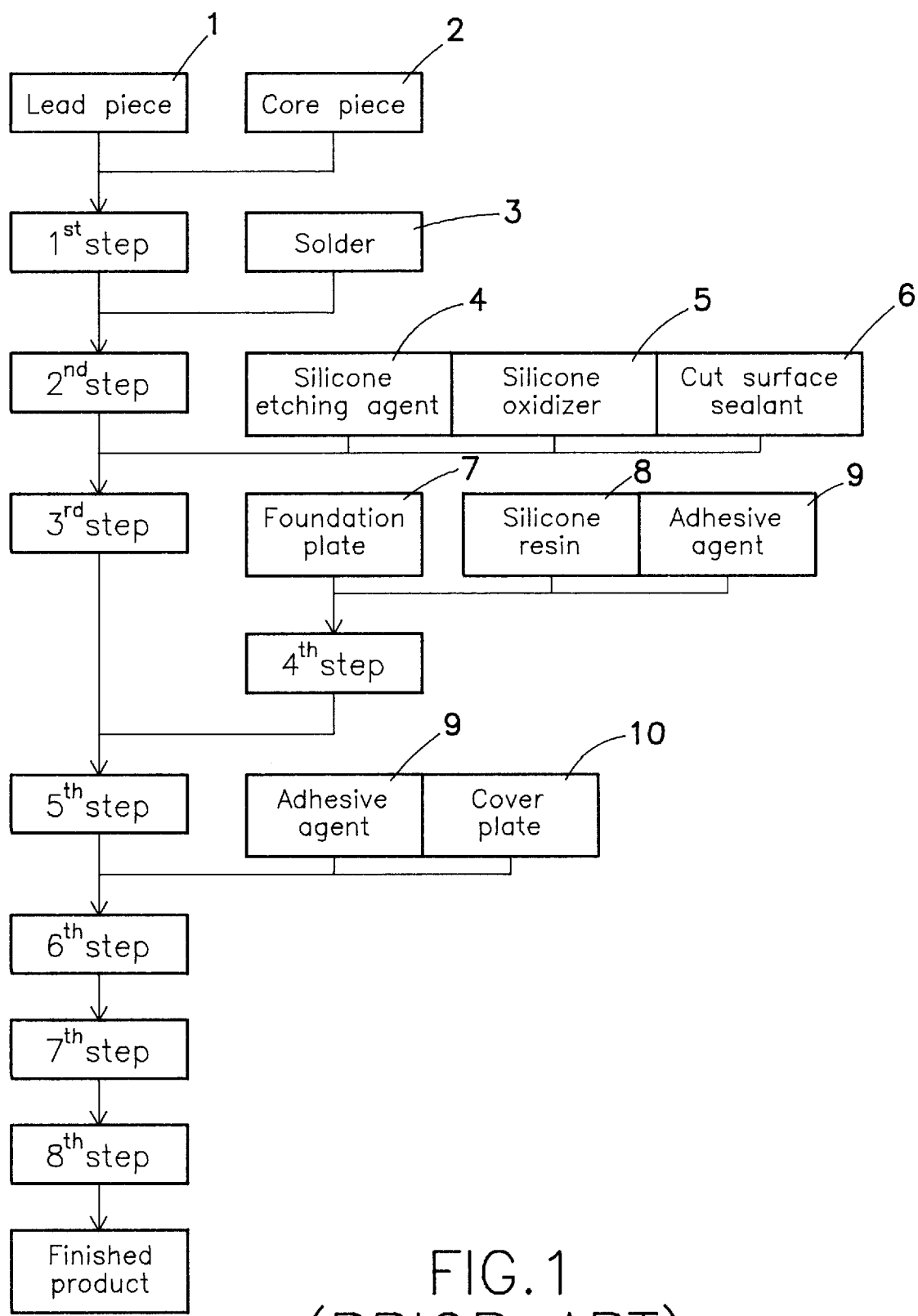
FIG. 1 is the flow chart of sealing and packaging processes of prior art.
Figure 2A:
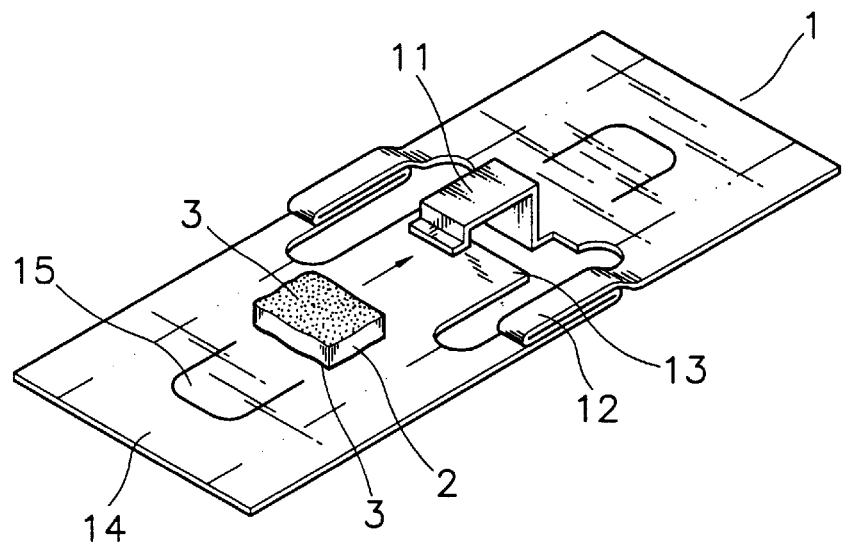
FIG. 2 is the perspective view of prior art.
Figure 2B:
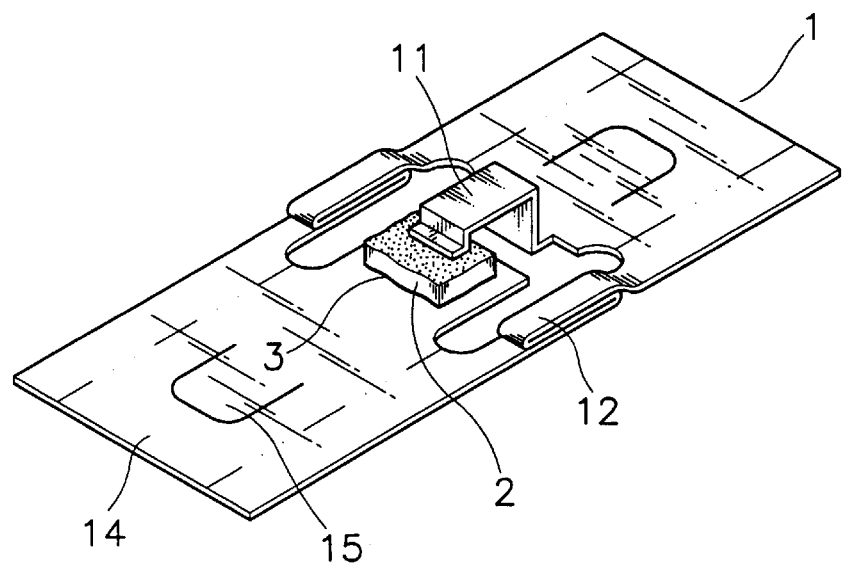
Figure 3:
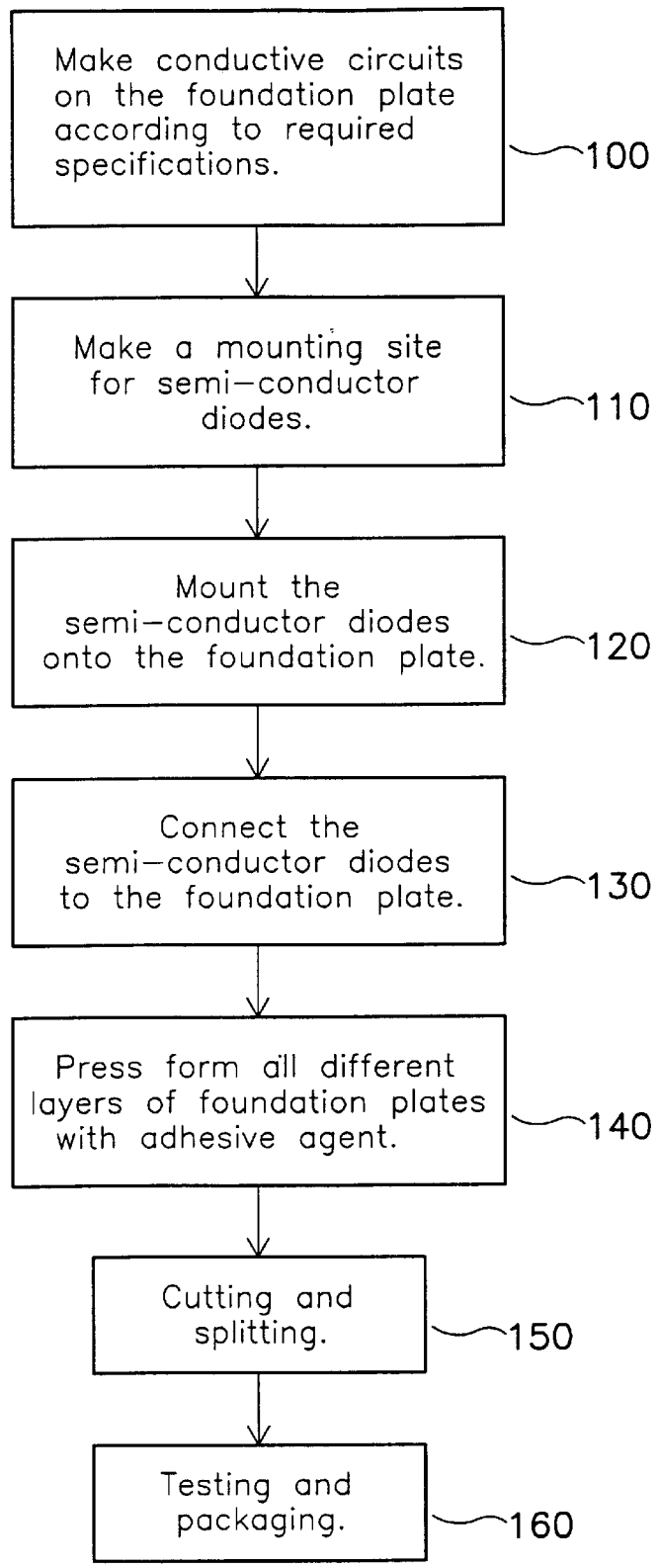
FIG. 3 is the flow chart of production of the subject invention.
Figure 5:
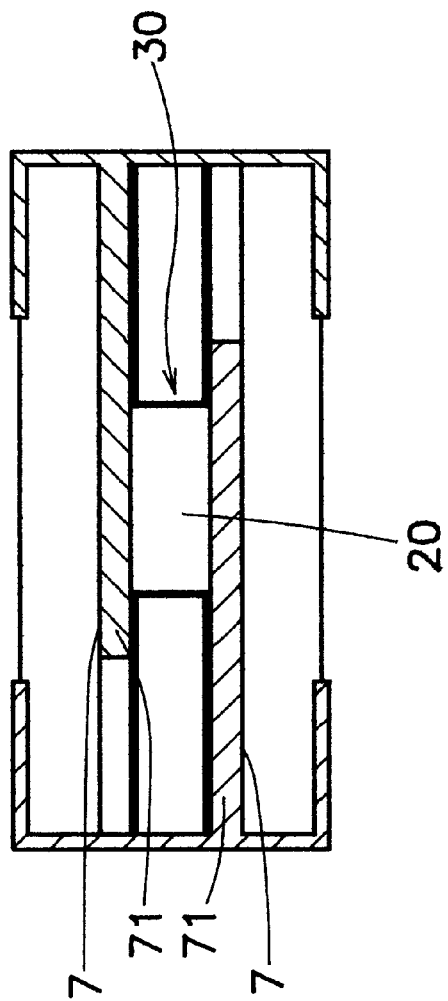
FIG. 5 is the section view of the subject invention.
Figure 4:
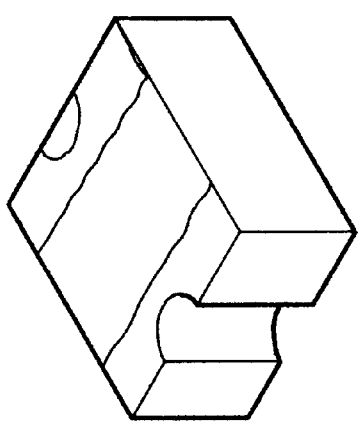
FIG. 4 is the appearance view of the subject invention.

DESCRIPTION OF NUMERALS AND ASSEMBLED COMPONENTS 30 mounting site
20 core piece
7 foundation plate
71 conductor circuit Referring to FIGS. 3, 4 and 5, the subject invention involves a method production of fiberglass reinforced resin plate type semi-conductor diodes, comprising of a foundation plate (or, a fiberglass reinforced resin plate, or shortened as FRP) 7, semi-conductor diode 20 and mounting site 30, and other components, with its production processes including the following stages as shown in FIG. 3:

(1) First of all, on the foundation plate 7, make a conductor circuit (copper foil circuit is made by corrosion) 71 according to required conducting wiring as indicated in block 100;

(2) Make a mounting site 30 for the semi-conductor diode 20 on the foundation plate 7 as indicated in block 110;

(3) Mount the semi-conductor diode 20 on the foundation plate 7 as indicated in block 120;

(4) Connect the electrode of semi-conductor diode 20 to the foundation plate 7 by the following steps represented by the blocks 130, 140, 150 and 160:

A) Jump joint the semi-conductor diode electrode to the circuit on the foundation plate by electrodeless plating.

B) Jump joint the semi-conductor diode electrode to the circuit on the foundation plate by conductive glue.

C) Connect the semi-conductor diode electrodes to the foundation plate circuit by solder welding.

D) Seal the foundation plate circuit to the semi-conductor diode electrodes with Press Contact in folding, instead of conductive connection.

(5) Stack and press several layers of foundation plates 7 with adhesive bond (glue) according to actual requirements;

(6) Cutting, splitting;

(7) Test, packaging.

By means of special designs in production processes, the following features can be assured:

1) Any styles of circuits can be designed on the foundation plate according to actual requirements. So, it is free from the restriction on the lead frame due to mechanical support that results in failure of effective designing of more sophisticated or finer circuits.

2) The circuits on the foundation plate can be designed to include connecting holes (not shown in drawings) to connect the circuits of different layers of foundation plates, so as to configure multilayer circuits (which is impossible in the case of a lead frame).

3) Because the lead wiring is integrated in the whole foundation plate, it enables easy operation, convenient processing, and will not be damaged by mechanical components.

4) Direct production of the wiring onto the foundation plate is a familiar skill of printed-circuit board manufacturers who can ensure better control of superior quality and reduce the production costs.

Besides adhesive glue that can be used as the adhesive bond, the subject invention can also use Pre Preg as the adhesive to join several layers of foundation plates. Said Pre Preg is a plate-shaped material to be processed directly (such as drilling, punching, cutting, etc.) on it, and can be adhered together after being heated and squeezed.

The use of Pre Preg involves the following features:

1) Machining is possible.

2) Due to its plate-shaped material, it will be easily adhered to a foundation plate for processing. Also, when it is subjected to curing process, it has the same material properties with those of fiberglass reinforced plastic (FRP) foundation plate.

3) Pre Preg is an ordinary material regularly used by printed-circuit board manufacturers. So, it is easily available at inexpensive costs.

Summing up, the subject invention of "the production of fiberglass reinforced resin plate-type semi-conductor diodes" involves the direct production of the lead wiring of semi-conductor diodes onto a fiberglass reinforced resin foundation plate, to supersede conventional lead frame, to enable the design of any styles to suit actual needs. With such unprecedented features that have fully satisfied the requirements of a patent right, in accordance with the Patent Law, this application is duly filed to protect the subject inventor's rights and interests. Your favorable consideration should be appreciated. In case you have any questions or doubts, please feel completely free to let me know.

It is hereby declared that, the aforesaid descriptions and illustrations of preferred embodiments of the subject invention shall not be based to restrict or limit the scope of claims of the subject invention, and that all other variations with equivalent functions based on the descriptions and drawings herein shall be reasonably included in the scope of claims of the subject invention.

We claim:

1. A method of production of fiberglass reinforced resin plate semi-conductor diodes having electrodes including the steps of:
   (a) establishing a conductive circuit on a fiberglass reinforced resin foundation plate;
   (b) providing a mounting site on said foundation plate;
   (c) mounting said semi-conductor diodes on said foundation plate;
   (d) connecting said electrodes of said semi-conductor diodes to said foundation plate;
   (e) stacking a plurality of said foundation plates and respective connected semi-conductor diodes to form a plurality of foundation plate layers;
   (f) press forming said plurality of foundation plate layers each to the other; and,
   (g) cutting extraneous material from said plurality of foundation plates.

* * * * *